(12) United States Patent
Gardner et al.

(10) Patent No.: US 6,214,690 B1
(45) Date of Patent: *Apr. 10, 2001

(54) METHOD OF FORMING A SEMICONDUCTOR DEVICE HAVING INTEGRATED ELECTRODE AND ISOLATION REGION FORMATION

(75) Inventors: Mark I. Gardner, Cedar Creek; Mark C. Gilmer, Austin, both of TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/993,415

(22) Filed: Dec. 18, 1997

(51) Int. Cl.[7] .................................................. H01L 21/76
(52) U.S. Cl. ........................ 438/400; 438/424; 438/296
(58) Field of Search .................... 438/296, 400, 438/424, 427

(56) References Cited

U.S. PATENT DOCUMENTS

| | | | |
|---|---|---|---|
| 4,200,474 | * 4/1980 | Morris | 438/762 |
| 5,292,683 | * 3/1994 | Dennison | 438/296 |
| 5,376,578 | * 12/1994 | Hsu et al. | 438/289 |
| 5,637,525 | * 6/1997 | Dennison | 438/232 |
| 5,716,861 | * 2/1998 | Moslehi | 438/231 |
| 5,858,843 | * 1/1999 | Doyle et al. | 438/299 |
| 5,879,983 | * 3/1999 | Segawa et al. | 438/253 |
| 5,946,581 | * 8/1999 | Gardner et al. | 438/307 |

* cited by examiner

*Primary Examiner*—Charles Bowers
*Assistant Examiner*—William M. Brewster

(57) ABSTRACT

The present invention generally provides a semiconductor device and fabrication process in which gate electrode formation is integrated with the formation of isolation regions. Consistent with one embodiment of the invention, the semiconductor device is formed by forming at least two adjacent gate electrode stacks of the substrate. A layer of dielectric material is formed over regions of the substrate between the two adjacent gate electrode stacks and portions of the dielectric material layer are selectively removed to leave an isolation block of the dielectric material between the two adjacent gate electrode stacks. The gate electrode stacks may, for example, have a thickness ranging from about 2,500 to 6,000 Å. In accordance with one aspect of the invention, active regions are formed in the substrate between the isolation block and at least one of the gate electrode stacks.

29 Claims, 3 Drawing Sheets

METHOD OF FORMING A SEMICONDUCTOR DEVICE HAVING INTEGRATED ELECTRODE AND ISOLATION REGION FORMATION

FIELD OF THE INVENTION

The present invention relates to semiconductor devices, and particularly, to semiconductor devices having integrated gate electrode and isolation region formation.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. Such silicon-based semiconductor devices often include metal-oxide-semiconductor (MOS) transistors, complimentary MOS (CMOS) transistors, bipolar transistors, BiCMOS transistors, etc.

Each of these semiconductor devices generally include a semiconductor substrate on which a number of active devices are formed. The particular structure of a given active device can vary between transistors. For example, in MOS transistors, an active device generally includes source and drain regions and a gate electrode which modulates current between the source and drain regions. In bipolar transistors, an active device generally includes a base, and collector, and an emitter.

A typical semiconductor device containing a large number of transistors. As is well known, numerous process steps are carried out in the fabrication of a semiconductor device. Each of these steps adds to the cost of the final product by increasing the fabrication time and complexity and by increasing the cost of materials. Take the formation of isolation regions for example. Conventional semiconductor manufacturing processes involve the formation of isolation regions prior to the formation of the transistor structures, such as gate electrodes.

One known technique for isolating active devices on a semiconductor substrate is LOCOS (for LOCal Oxidation of Silicon) isolation. LOCOS isolation generally involves the formation of a recessed or semi-recessed oxide in the nonactive (or field) areas of the substrate which will be used to separate active devices. In a typical LOCOS process, a thin silicon dioxide layer, often referred to as a pad oxide layer is grown on the surface of semiconductor substrate. A relatively thick layer of silicon nitride is then deposited over the pad oxide layer. Using a mask and etch process, the pad oxide/nitride layers are then selectively removed to define active regions (generally those regions masked by the pad oxide/nitride layers) where transistors will be formed and field regions (generally those regions over which the pad oxide/nitride layers have been removed). The nitride layer acts as a mask during subsequent oxide growth. An oxide, typically referred to as a field oxide, is thermally grown in the field regions to a thickness ranging from 0.3 to 1.0 $\mu$m to electrically isolate the active regions. The pad oxide layer and nitride masking layer are then removed to expose the active regions of the substrate. Further processing steps are then carried out to form active devices in the active regions.

One alternative to LOCOS isolation is trench isolation. Trench isolation generally involves forming a patterned nitride mask over the substrate to define active regions where transistors will be formed and field regions, etching trenches in field regions of the substrates, oxidizing the trenches and filling the trenches with a deposited silicon dioxide layer, which is typically etched back to yield a relatively planar surface. Each of these steps, however, adds to the overall cost and time to manufacture a semiconductor device.

SUMMARY OF THE INVENTION

The present invention generally provides a semiconductor device and fabrication process in which gate electrode formation is integrated with the formation of isolation regions.

Consistent with one embodiment of the invention, the semiconductor device is formed by forming at least two adjacent gate electrode stacks of the substrate. A layer of dielectric material is formed over regions of the substrate between the two adjacent gate electrode stacks and portions of the dielectric material layer are selectively removed to leave an isolation block of the dielectric material between the two adjacent gate electrode stacks. The gate electrode stacks may, for example, have a thickness ranging from about 2,500 to 6,000 Å. In accordance with one aspect of the invention, active regions are formed in the substrate between the isolation block and at least one of the gate electrode stacks.

The above summary of the p resent invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
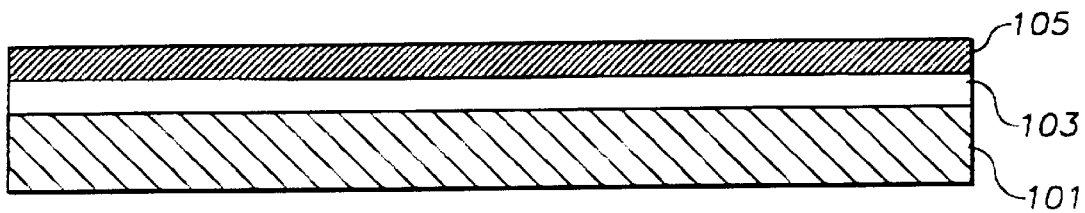
FIGS. 1A–1F illustrate a fabrication process in accordance with one embodiment of the invention.
Figure 1B:
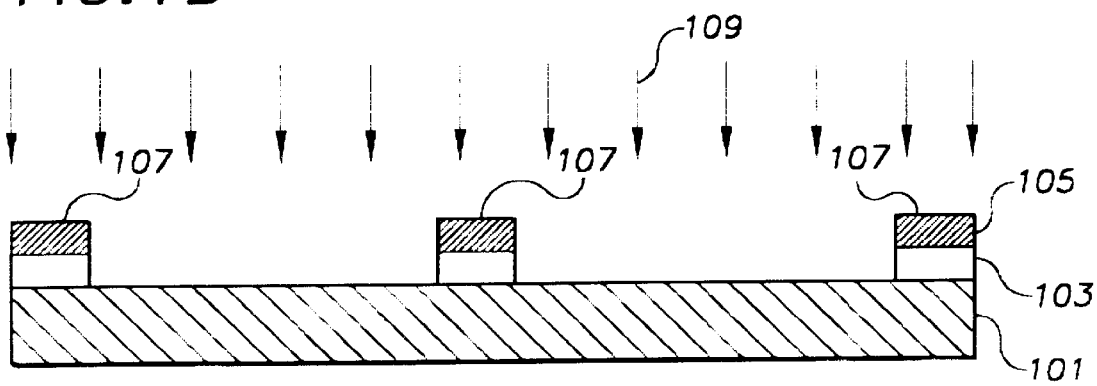

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention is believed to be applicable to a number of semiconductor devices that employ isolation regions to separate active device regions. Such semiconductor devices may include MOS, CMOS, bipolar, and BiCMOS devices, for example. While the present invention is not limited to these semiconductor devices, an appreciation of various aspects of the invention will be gained through a discussion of the fabrication processes in connection with the examples provided below.

FIGS. 1A–1F illustrate a process for fabricating a semiconductor device in accordance with an example embodiment of the invention. In accordance with this process, a high permittivity gate insulating layer 103 is formed over a substrate 101. The substrate 101 is typically formed from silicon. The high permittivity gate insulating layer 103 is typically formed from a material having a higher dielectric constant than that of silicon dioxide (dielectric constant =4.2). Suitable high permittivity materials include barium strontium titanate, titanium dioxide, lead zinc titanate, and manganese dioxide for example. Suitable thicknesses for the high permittivity gate insulating material range from about 2000 to 4000 Angstroms for many applications. For a high permittivity material having a dielectric constant of 200 (such as some barium strontium titanates, for example) this may correspond to an equivalent thickness of about 10 to 20 Angstroms of silicon dioxide.

A gate electrode layer 105 is formed over the high permittivity gate insulating layer 103. The resultant structure is illustrated in FIG. 1A. The gate electrode layer 105 will be used to form gate electrodes and may be formed from a number of different materials including, for example, polysilicon or a metal. The gate electrode layer 105 may be formed using, for example, well-known deposition techniques. The thickness of the gate electrode layer 105 is suitably selected in consideration of the desired thickness of the gate electrode stacks (i.e., gate electrode and high permittivity gate insulating layer) taking into account the thickness of the high permittivity gate insulating layer 103. Suitable thicknesses for the gate electrode layer range from about 500 to 4000 Angstroms for many applications. This provides a gate electrode stack having thicknesses ranging from about 2500 to 6000 Angstroms.

It is noted that prior to forming the insulating layer 103, background implants such as, a punchthrough implant, voltage threshold (VT) implants and well implants may be performed into the substrate 102, to provide background doping for the device. These background implants may be performed using, for example, well-known techniques.

A patterned mask (not shown) is formed over the gate electrode layer 105 to mask portions of the gate electrode layer 105 where gate electrodes will be formed and to expose regions of the gate electrode layer 105 which will be removed. As will be discussed below, a channel stop or field dopant will be implanted into portions of the substrate under the exposed regions of the gate electrode layer 105. In this manner, the patterned mask is used to define the gate electrodes and portions of the substrate which receive a field implant. While a single mask may advantageously be used, it should be appreciated that multiple masks could be used as well. Exposed portions of the gate electrode layer 105 and typically the underlying high permittivity gate insulating layer 103 are removed to form one or more gate electrode stacks 107 over the substrate. Formation of the mask and removal of the gate electrode layer 105 and the high permittivity layer 103 may be performed using, for example, well-known photolithography and etching techniques.

A channel stop or field dopant 109 is implanted into regions of the substrate between adjacent gate electrode stacks 107 to form field regions (not shown) in the substrate 101. The patterned mask may be removed from or left on the gate electrode stacks 107 during the field implant. If left on during the implant, the patterned mask is typically removed thereafter. The field regions may be formed by implanting a dopant of the opposite conductivity type as the dopant that will be used to form source/drain regions in the substrate. For example, field regions for NMOS devices are typically implanted with a p-type dopant, such as boron, while field regions for a PMOS device are typically implanted with a n-type dopant, such as arsenic. As should be appreciated, in a CMOS device, suitable masking is typically carried out to selectively implant PMOS and NMOS field regions.

The field dopant is typically a shallow low dose implant. Suitable implant dosages and energies for a field dopant range from about 5 to 20 keV and 1E12 ($1\times10^{12}$) to 1E13 ($1\times10^{13}$) atoms/cm$^2$, respectively, for many applications. While the field dopant in the illustrated embodiment will also be implanted into future source/drain regions of the device, the field dopant will typically have a negligible impact on source/drain performance due to the much higher dopant dosages which are used in source/drain formation. In any event, the dosages for the source/drain implant(s) may be adjusted to account for any field dopant, if desired.

Figure 1C:
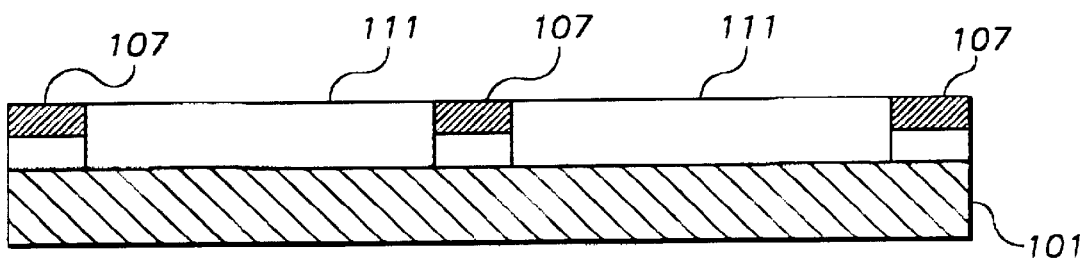

A layer of dielectric material 111 is formed over regions of the substrate 101 between adjacent gate electrode stacks 107. The dielectric material 111 will be used to form isolation blocks between adjacent active devices (e.g., transistors) and is typically formed from a low permittivity material, such as silicon dioxide, for example. The resultant structure is illustrated in FIG. 1C. The dielectric material layer 111 may be formed, for example, by depositing a layer of the dielectric material 111 over the substrate and planarizing the dielectric material 111 with the upper surface of the gate electrode stacks 107. This may be performed using well-known deposition and chemical-mechanical polishing techniques, for example. Suitable initial thicknesses of the dielectric material 111 (e.g., prior to planarization) range from 6000 to 12000 Angstroms depending on the height of the gate electrode stacks 107.

At this point, the substrate 101 may optionally be annealed to drive-in and activate the field dopant 109. This may be performed using, for example, well-known rapid thermal anneal techniques. Alternatively, the field dopants 109 may be annealed prior to forming the dielectric materials 111 or later in the process (e.g., along with the source/drain anneal).

Figure 1D:
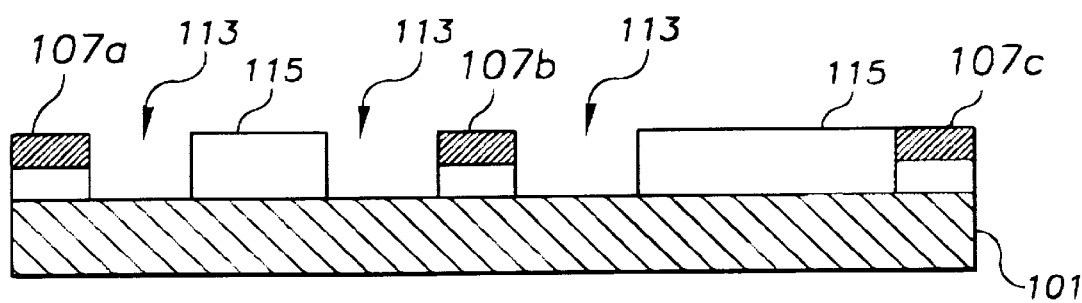

Portions of the dielectric material layer 111 are removed to form openings 113 in locations corresponding to desired areas for source/drain regions. As should be appreciated, the width of the openings 113 is selected in consideration of the desired width of the active regions which will be formed therein. Advantageously, the etching techniques used to partially remove the dielectric material 111 may be selective with respect to the gate electrode stacks 107 and leave the gate electrode stacks 107 substantially intact. Typically, the dielectric material layer 111 is completely removed to expose regions of the substrate 101 in these openings or access paths 113. Source/drain regions will be formed in the openings 113, while remaining portions of the dielectric material layer 111 will be used as isolation blocks to electrically isolate adjacent gate electrode stacks 107 and their associated active regions. The resultant structure is illustrated in FIG. 1D. Selective removal of the dielectric material 111 may, for example, be performed by forming a second patterned mask over the dielectric material 111 (and gate electrode stacks 107) to expose portions of the dielectric material 111 defining locations 113 for source/drain regions and cover portions of the dielectric material 111 defining isolation regions. Formation of the patterned mask and removal of portions of the dielectric material layer 111 may be performed using, for example, well-known photolithography etching techniques, such as plasma etching.

Figure 1E:
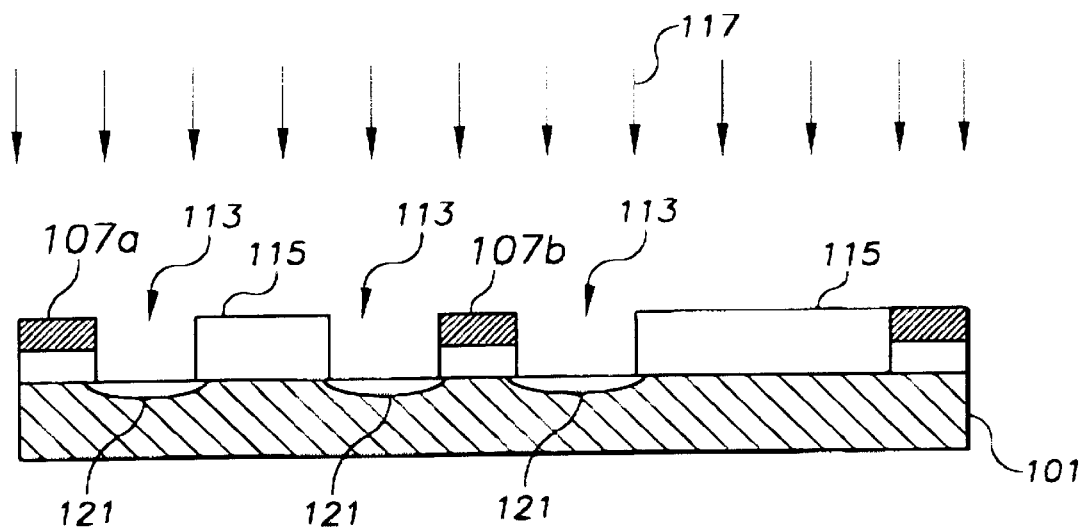

Active regions such as source/drain regions are formed in the openings. The source/drain regions may be formed in a number of different manners. In the illustrated embodiment, the formation of lightly-doped drain (LDD) source/drain regions is illustrated. In this process, a low dose of a dopant 117 (e.g., boron or arsenic) is implanted into the substrate 101 to form shallow, lightly-doped regions 121 within the openings 113. The implant characteristics depend on the type of dopant being implanted. Suitable implant energies and dosages range from about 5 to 60 keV and 5E13 to 9E14 atoms/cm$^2$ for many applications. The resultant structure is illustrated in FIG. 1E.

Figure 1F:
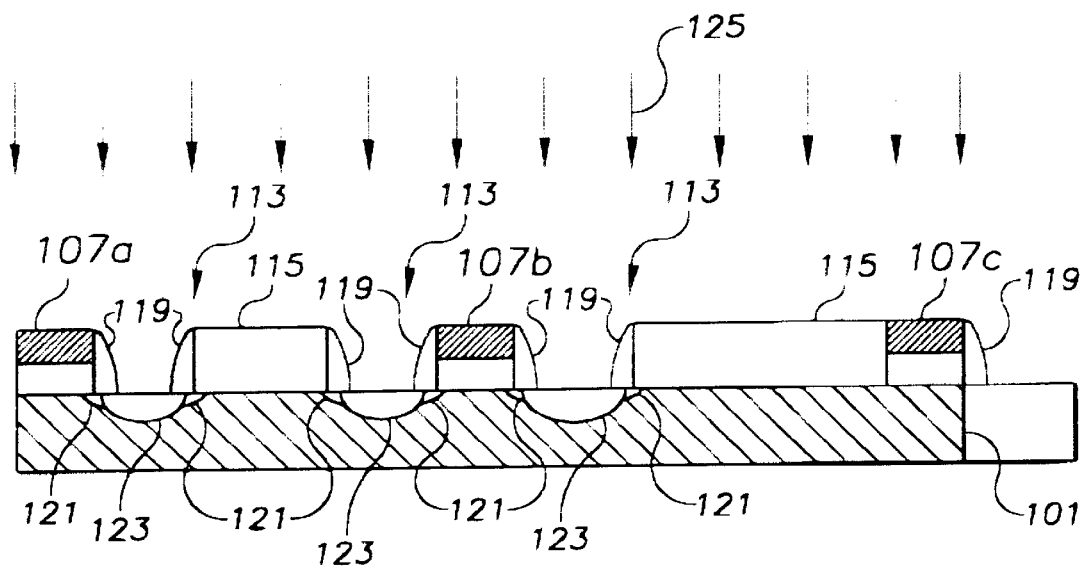

Spacers 119 are formed on sidewalls of the gate electrode stacks 107a–c and sidewalls of the isolation blocks 115, as illustrated in FIG. 1F. The spacers 119 may be formed using, for example, well-known deposition and etching techniques. Using the spacers 119 for alignment, a heavy dose of a second dopant 125 (typically the same dopant or a similar type dopant as dopant 117) is implanted into the substrate 101 through the openings 113 to form deeper, heavily-doped regions 123 in the substrate 101. This implant is commonly referred to as a source/drain implant. Suitable implant energies and dopant dosages range for the source/drain implant from about 5 to 60 keV and 1E15 to 7E15 atoms/cm for many applications. The resultant structure is illustrated in FIG. 1F. Fabrication may continue with well-known fabrication steps, such as silicidation, contact formation, and so forth to complete the ultimate device structure.

The structure illustrated in FIG. 1F includes a plurality of gate electrode stacks 107a–c separated by isolation blocks 115. Some gate electrode stacks (e.g., 107a and 107b) may be associated with source/drain regions and used as transistors. Other gate electrode stacks (e.g., 107c) may be used as capacitors. The isolation blocks 115 typically lie against those gate electrode stacks used as capacitors. The isolation blocks 115 generally define isolation regions (e.g., blocks 115 and underlying field dopant 109) which electrically isolate adjacent active devices (e.g., transistors or capacitors).

Figure 2A:
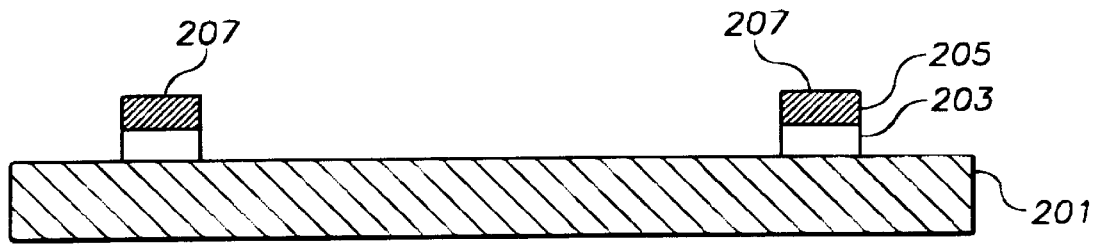
FIGS. 2A–2D illustrate another example fabrication process in accordance with another embodiment of the invention.

FIGS. 2A–2D illustrate a process for forming an isolation region with a trench in accordance with an embodiment of the invention. In this process, a high permittivity gate insulating layer 203 is formed over a substrate 201 and a gate electrode layer 205 is formed over the high permittivity gate insulating layer 203. Portions of the gate electrode layer 205 and typically the underlying portions of the gate insulating layer 203 are removed to form one or more gate electrode stacks 207 over the substrate 201. The resultant structure is illustrated in FIG. 2A. These steps may be performed in a similar manner as discussed above.

Figure 2B:
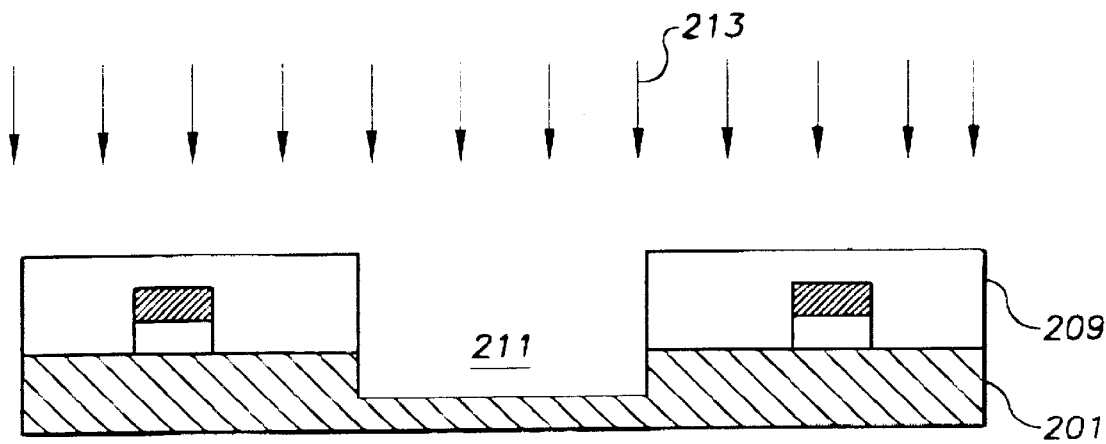

A masking layer 209 is formed over the substrate 201 and portions of the masking layer 209 are selectively removed to expose regions of the substrate 201. The exposed regions of the substrate (only one of which is shown) are then etched to form a trench 211 in the substrate 201. A field dopant 213 is implanted into the substrate 201 to form a field region in the substrate 201 below the trench 211. The field implant energies and dosages may be similar to those discussed above. The field implant may be performed through the masking layer 209 as shown or the masking layer 209 may be removed. The resultant structure is illustrated in FIG. 2B. Formation of masking layer 209 and trench 211 may be performed using, for example, well-known photolithography and etching techniques. Suitable depths for the trench range from about 0.1 to 0.4 microns for many applications.

Figure 2C:
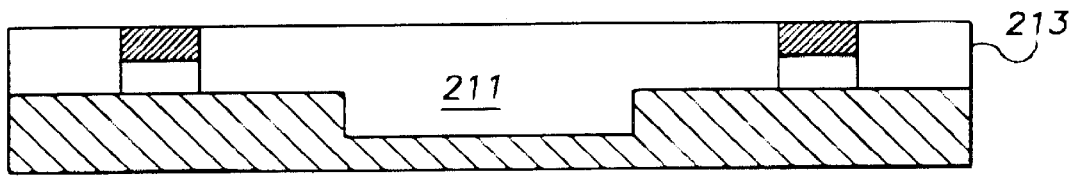
Figure 2D:
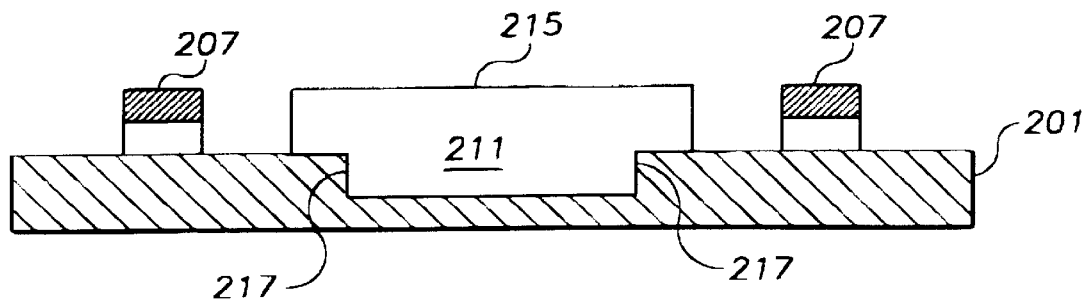

The mask 209 is removed and a layer of dielectric material 213 is formed over the substrate 201 and within the trench 211. Optionally, the trench may be oxidized prior to filling the trench 211 with the dielectric material 211. The layer of dielectric material 211 may be similar to the layer of dielectric material 111 discussed above. The resultant structure is illustrated in FIG. 2C. Portions of the dielectric material are removed to typically expose regions of the substrate in which active regions will be formed. The remaining portions of the dielectric material 211 form isolation blocks 215 (only one of which is shown) used to isolate adjacent gate electrode stacks 207. The isolation block 215 may cover the corners 217 of the substrate 201 forming the trench. This advantageously increases the reliability of the device. Fabrication may continue with source/drain formation (e.g., in a similar manner as discussed above) followed by conventional processing techniques such as silicidation, contact formation and so forth to complete the ultimate device structure.

While the above embodiments generally illustrate fabrication processes in connection with a single MOS region such as a PMOS or an NMOS region, the invention is not so limited. The present invention may be readily applied to CMOS devices. In which case, PMOS and NMOS regions are suitably masked during the various implants (e.g., source/drain implants and field implants).

As noted above, the present invention is applicable to a number of different semiconductor devices which employ isolation regions. The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A process of fabricating a semiconductor device, comprising in sequence, the steps of:
   forming at least two contiguously adjacent gate electrode stacks over the substrate;
   forming dielectric material over regions of the substrate between the two adjacent gate electrode stacks; and
   selectively removing portions of the dielectric material to leave an isolation block of the dielectric material disposed in a region between the two adjacent gate electrode stacks, wherein an access path is formed on at least one side of the isolation block, the access path being bounded by the two adjacent gate electrode stacks and partially exposing the substrate.

2. The process of claim 1, further including implanting a field dopant into the regions defined by the access path on the substrate between the adjacent gate electrode stacks to form a field region prior to forming the dielectric material; also including implanting another field dopant into the region defined by the access path on the substrate between the isolation block and the gate electrode, therein forming an active region; and further including forming spacers on sidewalls of the gate electrodes and the isolation blocks prior to implanting another dopant into the active region that will form the source and drain regions.

3. The process of claim 1, further including implanting background dopants into the substrate prior to forming the gate electrode stacks, the background dopants forming a threshold voltage region and a well region in the substrate.

4. The process of claim 1, further including forming active regions in the substrate within the access path between the isolation block and at least one of the gate electrode stacks.

5. The process of claim 4, wherein forming the active regions includes implanting a dopant into the regions of the substrate between the isolation block and the gate electrode stacks.

6. The process of claim 4, wherein the active region is an LDD source/drain region.

7. A process of fabricating a semiconductor device, comprising in sequence, the steps of:
   forming at least two contiguously adjacent gate electrode stacks over the substrate;
   forming dielectric material over regions of the substrate between the two adjacent gate electrode stacks;
   forming a trench in the substrate between the gate electrode stacks; and selectively removing portions of the dielectric material to leave an isolation block of the dielectric material disposed in a region between the two adjacent gate electrode stacks, wherein an access path is formed on at least one side of the isolation block, the access path being bounded by the two adjacent gate electrode stacks and partially exposing the substrate.

8. The process of claim 7, wherein the isolation block is formed at least in part in the trench.

9. The process of claim 1, wherein the isolation block is formed on a sidewall of one of the two adjacent gate electrode stacks.

10. The process of claim 1, wherein forming the at least two adjacent gate electrode stacks includes:
   forming a gate insulating layer from a high permittivity material over the substrate;
   forming a gate electrode layer over the gate insulating layer; and
   selectively removing portions of the gate insulating layer and the gate electrode layer to form the gate electrode stacks.

11. The process of claim 10, wherein the gate insulating layer is formed of a dielectric having a permittivity greater than 20.

12. The process of claim 10, wherein selectively removing portions of the gate insulating layer and the gate electrode layer to form the gate electrode stacks includes forming a patterned mask over the gate electrode layer defining regions for the gate electrode stacks and regions for a field implant.

13. The process of claim 1, wherein selectively removing portions of the dielectric material includes forming a patterned mask over the dielectric material, the pattern mask defining locations for active regions and locations for isolation regions.

14. The process of claim 1, wherein the gate insulating layer is formed with a thickness ranging from about 2000 to 4000 angstroms.

15. The process of claim 14, wherein the gate electrode stacks are formed with a thickness ranging from about 2500 to 6000 angstroms.

16. The process of claim 1, wherein the dielectric material is of a low permittivity material.

17. A process of fabricating a semiconductor device, comprising in sequence the steps of:
   forming at least two contiguously adjacent gate electrode stacks over the substrate, the gate electrode stacks having a thickness ranging from about 2500 to 6000 angstroms;
   implanting a field dopant into a region of the substrate between the adjacent gate electrode stacks;
   depositing an oxide over the region of the substrate between the adjacent gate electrode stacks; and
   etching portions of the oxide to leave an isolation oxide block between the adjacent gate electrode stacks, wherein an access path is formed on at least one side of the isolation block, the access path being bounded by the two adjacent gate electrode stacks and partially exposing the substrate; and
   implanting a dopant into regions of the substrate between the isolation block and at least one of the gate electrode stacks to form an active region in the substrate.

18. The process of claim 17, further including forming spacers on sidewalls of the gate electrodes and the isolation blocks prior to implanting another dopant into the active region that will form the source and drain regions.

19. A process of fabricating a semiconductor device, comprising in sequence the steps of:
   forming at least two contiguously adjacent gate electrode stacks over the substrate, the gate electrode stacks having a thickness ranging from about 2500 to 6000 angstroms;
   implanting a field dopant into a region of the substrate between the adjacent gate electrode stacks;
   depositing an oxide over the region of the substrate between the adjacent gate electrode stacks;
   forming a trench in the substrate between the gate electrode stacks; and
   etching portions of the oxide to leave an isolation oxide block between the adjacent gate electrode stacks, wherein an access path is formed on at least one side of the isolation block, the access path being bounded by the two adjacent gate electrode stacks and partially exposing the substrate; and
   implanting a dopant into regions of the substrate between the isolation block and at least one of the gate electrode stacks to form an active region in the substrate.

20. The process of claim 19, wherein the isolation block is formed at least in part in the trench.

21. The process of claim 17, wherein the isolation block is formed on a sidewall of one of the two adjacent gate electrode stacks.

22. The process of claim 18, wherein forming the at least two adjacent gate electrode stacks includes:
   forming a gate insulating layer from a high permittivity material over the substrate;
   forming a gate electrode layer over the gate insulating layer; and
   selectively removing portions of the gate insulating layer and the gate electrode layer to form the gate electrode stacks.

23. The process of claim 22, wherein the two contiguously adjacent gate electrode stacks are transistor gate electrode stacks.

24. The process of claim 10, wherein the gate insulating layer is formed of a dielectric having a permittivity greater than 200.

25. The process of claim 23, wherein the high permittivity material is selected for from the group consisting of barium strontium titanate, lead zinc titanate and manganese dioxide.

26. The process of claim 9, wherein the sidewall of the electrode stack opposite the isolation block there is formed a spacer.

27. The process of claim 21, wherein the sidewall of the electrode stack opposite the isolation block there is formed a spacer.

28. The process of claim 8, after forming the isolation block, further including the steps of:
   implanting a field dopant into the region defined by the access path on the substrate between the isolation block and the gate electrode, therein forming an active region; and
   forming spacers on sidewalls of the gate electrodes and the isolation blocks prior to implanting another dopant into the active region that will form the source and drain regions.

29. The process of claim 20, after forming the isolation block, further including the steps of:
   implanting a field dopant into the region defined by the access path on the substrate between the isolation block and the gate electrode, therein forming an active region; and
   forming spacers on sidewalls of the gate electrodes and the isolation blocks prior to implanting another dopant into the active region that will form the source and drain regions.

* * * * *

UNITED STATES PATENT AND TRADEMARK OFFICE
CERTIFICATE OF CORRECTION

PATENT NO. : 6,214,690 B1
DATED : April 10, 2001
INVENTOR(S) : Gardner et al.

It is certified that error appears in the above-identified patent and that said Letters Patent is hereby corrected as shown below:

Column 2,
Line 27, "p resent" shoul read -- present --.

Column 3,
Line 32, "102" should read -- 101 --.

Signed and Sealed this

Seventeenth Day of September, 2002

Attest:

Attesting Officer

JAMES E. ROGAN
Director of the United States Patent and Trademark Office